United States Patent
Lehmann et al.

(10) Patent No.: US 6,807,812 B2
(45) Date of Patent: Oct. 26, 2004

(54) PULSE TUBE CRYOCOOLER SYSTEM FOR MAGNETIC RESONANCE SUPERCONDUCTING MAGNETS

(75) Inventors: Gregory A. Lehmann, Florence, SC (US); Roy A. Mangano, Florence, SC (US); Clifford J. Ginfrida, Florence, SC (US); Kathleen W. McGuinness, Florence, SC (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/391,872

(22) Filed: Mar. 19, 2003

(65) Prior Publication Data
US 2004/0182089 A1 Sep. 23, 2004

(51) Int. Cl.[7] .............................. F17C 5/02; F25B 9/00; F28F 7/00
(52) U.S. Cl. ................ 62/47.1; 62/6; 165/185
(58) Field of Search .......... 62/47.1, 6, 259.2; 165/185

(56) References Cited

U.S. PATENT DOCUMENTS

| | | | |
|---|---|---|---|
| 4,790,147 A | * | 12/1988 | Kuriyama et al. ............ 62/51.1 |
| 5,416,415 A | * | 5/1995 | Dorri et al. ................. 324/318 |
| 5,430,423 A | * | 7/1995 | Herd et al. .................. 335/216 |
| 5,442,928 A | * | 8/1995 | Laskaris et al. ............. 62/51.1 |
| 5,613,367 A | * | 3/1997 | Chen ........................... 62/47.1 |
| 5,744,959 A | | 4/1998 | Jeker et al. |
| 5,782,095 A | * | 7/1998 | Chen ........................... 62/47.1 |
| 5,966,944 A | * | 10/1999 | Inoue et al. ................. 62/51.1 |
| 6,029,458 A | * | 2/2000 | Eckels ......................... 62/47.1 |
| 6,192,690 B1 | | 2/2001 | Stautner |
| 6,196,005 B1 | | 3/2001 | Stautner |
| 6,343,475 B1 | | 2/2002 | Ishikawa |

* cited by examiner

Primary Examiner—William C. Doerrier
(74) Attorney, Agent, or Firm—Christopher L. Bernard, Esq.

(57) ABSTRACT

A magnetic resonance assembly comprising, a liquid cryogen vessel, a liquid cryogen cooled conducting magnet disposed within the liquid cryogen vessel, a closed vaccum vessel surrounding the liquid cryogen vessel and spaced from the liquid cryogen vessel, a cooling device fixably attached to the vacuum vessel operable for providing cryogenic temperatures to the superconducting magnet, a heat exchanger device in thermal contact with the liquid cryogen vessel operable for heat exchange, and a bus bar in thermal contact with the cooling device and the heat exchanger device. The cooling device may be a pulse tube cryocooler capable of providing temperatures of about 4 K. A thermal bus bar of high purity aluminum or copper is used to connect and provide a spatial separation of a pulse tube cryocooler and a remote recondenser unit, thus reducing the overall height of the magnet assembly.

25 Claims, 7 Drawing Sheets

PULSE TUBE CRYOCOOLER SYSTEM FOR MAGNETIC RESONANCE SUPERCONDUCTING MAGNETS

BACKGROUND OF THE INVENTION

1. Field of the Invention

The present invention relates generally to the field of Magnetic Resonance (MR) magnets. More particularly, the present invention relates to pulse tube cryocooler integration and interface design for open and cylindrical MR superconducting magnets.

2. Description of the Related Art

As is well known in the art, a superconducting magnet may be made superconducting by placing it in an extremely cold environment, such as by enclosing it in a cryostat or pressure vessel and surrounding it with a liquid cryogen. Ultra low temperature refrigerators such as Gifford McMahon (GM) cryocoolers are widely used for maintaining the low temperature environment. The extreme cold ensures that the magnet coils are maintained in superconducting operation, such that when a power source is initially connected to the magnet coils (for a period of 10 minutes, for example) to introduce a current flow through the coils, the current will continue to flow through the coils even after the power is removed due to the absence of electrical resistance in the coils, thereby maintaining a strong magnetic field. Superconducting magnet assemblies find wide application in the field of MRI.

While GM cryocoolers are capable of providing cooling at around 4 K (liquid helium temperature), their use has several drawbacks. For one, they impart more vibrational energy to the superconducting magnets of an MRI system than is desirable, resulting in a lower image quality. Next, the acoustic signature tends to be high, resulting in complaints from doctors and technicians about coldhead chirp. In addition, GM cryocoolers have a large number of moving parts which makes them prone to frictional wear and subsequent breakdown.

In contrast to GM cryocoolers, pulse tube cryocoolers capable of providing cooling at 4 K, have far fewer drawbacks. It would be desirable to apply these cryocoolers on superconducting MR magnets, and particularly to superconducting magnets that are zero boiloff in design. Pulse tube cryocoolers offer distinct advantages for superconducting MR magnets. Pulse tubes impart much less vibrational energy to superconducting magnets than do GM cryocoolers. This improves the image quality of the MR scan and allows for more aggressive siting (i.e., allows for higher environmental/ground vibration) of the MR imaging system. The acoustic signature is less than that of a GM cryocooler, and the sound quality patterns are less annoying, resulting in a lower sound pressure level. And, pulse tube cryocoolers have far less moving parts than GM cryocoolers, which makes them more reliable.

Pulse tube cryocoolers provide unique integration challenges. Pulse tubes must be near vertically oriented (±100°) to achieve adequate cooling capacities. This creates challenges for the superconducting magnet cryostat design concerning maximum ceiling height for service and configuration of zero boiloff hardware. Zero boiloff technology requires that the cryocooler be mounted at the top of the magnet. If the recondensor is mounted directly to the pulse tube, the added height to the magnet will restrict access to the cryocooler and restrict the minimum opening through which the magnet can pass during installation. What is needed is a solution to mount the pulse tube lower while keeping the recondensor above the maximum liquid helium level. It is necessary to achieve a low thermal loss interface between the pulse tube cryocooler and a recondensor to minimize cooling power loss. It would further be desirable to eliminate the cryocooler sleeve used on conventional systems, due to the extra heat load added by the sleeve. This extra heat load requires that higher capacity cryocoolers be used, and reduces the useful life of the cryocooler.

BRIEF SUMMARY OF THE INVENTION

In one aspect, the present invention describes a magnetic resonance assembly comprising, a liquid cryogen vessel, a liquid cryogen cooled superconducting magnet disposed within the liquid cryogen vessel, a closed vacuum vessel surrounding the liquid cryogen vessel and spaced from the liquid cryogen vessel, a cooling device fixably attached to the vacuum vessel operable for providing cryogenic temperatures to the superconducting magnet, a heat exchanger device in thermal contact with the liquid cryogen vessel operable for heat exchange, and a bus bar in thermal contact with the cooling device and the heat exchanger device.

In another aspect, the cooling device comprises a pulse tube cryocooler operable for generating a temperature in the range of about 4 K. The pulse tube cryocooler is connected to a remote recondensor device via a thermal bus bar of either high purity aluminum or high purity copper. The pulse tube cryocooler and remote recondensor devices are connected to the thermal bus bar using a low thermal loss interface, such as a weld, a joint, a clamp, a bolted indium joint or combinations thereof. In a further aspect, the pulse tube cryocooler may be fixably attached to the vacuum vessel as a permanent part of the magnet cryostat.

In a still further aspect, the thermal bus bar allows the pulse tube cryocooler to be attached to the vacuum vessel at any desired position on the magnet. The thermal bus bar also allows the remote recondensor device to be located at any desired position within the vacuum vessel above a maximum liquid helium level. Therefore, the thermal bus bar provides great flexibility in the design of the magnet assembly, reducing the overall height of the assembly.

In a still further aspect, the heat exchanger device is connected to the liquid cryogen vessel via one or more lines operable for transporting gas, wherein the lines allow cryogen gas to flow upward into the heat exchanger device and recondensed cryogen liquid to flow back into the liquid cryogen vessel, and provide thermal and vibration isolation between the heat exchanger device and the liquid cryogen vessel.

In a still further aspect, the present invention describes a magnetic resonance assembly comprising a liquid cryogen vessel, a liquid cryogen cooled superconducting magnet disposed within the liquid cryogen vessel, a closed vacuum vessel surrounding the liquid cryogen vessel and spaced from the liquid cryogen vessel, a means for cooling fixably attached to the vacuum vessel, a means for heat exchange in thermal contact with the liquid cryogen vessel, and a means for connecting and providing a spatial separation of the cooling means and the heat exchange means.

The present invention describes systems that allow for open and cylindrical superconducting magnets to operate using a single cryocooler without the need for coldhead switching, a cooling device that allows more aggressive siting of cylindrical magnets due to less coldhead vibration, inherently quieter operation, improved reliability, reduced magnet heat load, reduced liquid helium boiloff and lower magnet height.

BRIEF DESCRIPTION OF THE DRAWINGS

A variety of specific embodiments of this invention will now be illustrated with reference to the Figures. In these Figures, like elements have been given like numerals.

DETAILED DESCRIPTION OF THE INVENTION

As required, detailed embodiments of the present invention are disclosed herein, however, it is to be understood that the disclosed embodiments are merely exemplary of the invention that may be embodied in various and alternative forms. Specific structural and functional details disclosed herein are not to be interpreted as limiting, but merely as a basis for the claims as a representative basis for teaching one skilled in the art to variously employ the present invention. Throughout the drawings, like elements are given like numerals. The systems described below apply to the cooling of open and cylindrical magnetic resonance (MR) superconducting magnets, however, in principle also apply to any cryogenic system which benefits from cryogen re-liquification.

Figure 1:
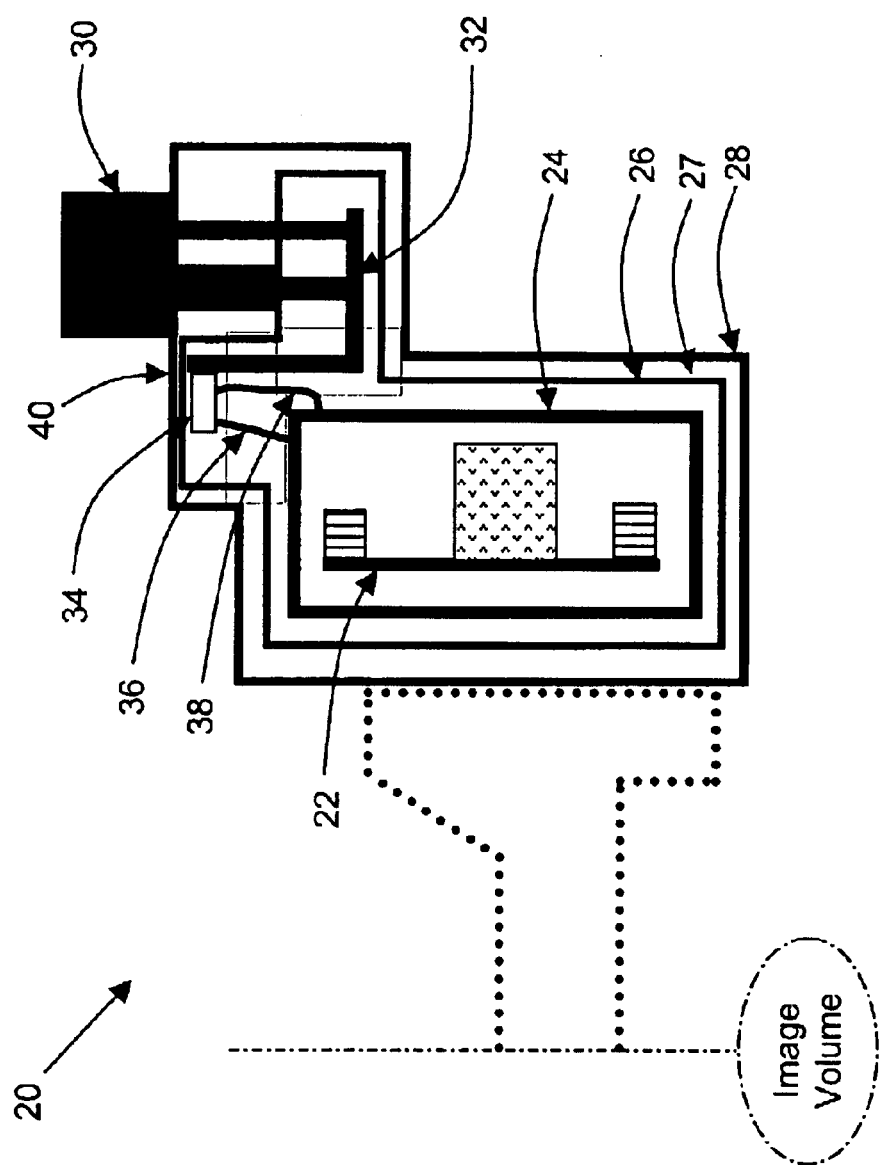
FIG. 1 is an illustration of an open superconducting magnet and cooling device assembly of an MRI system in accordance with an exemplary embodiment of the present invention.
Figure 2:
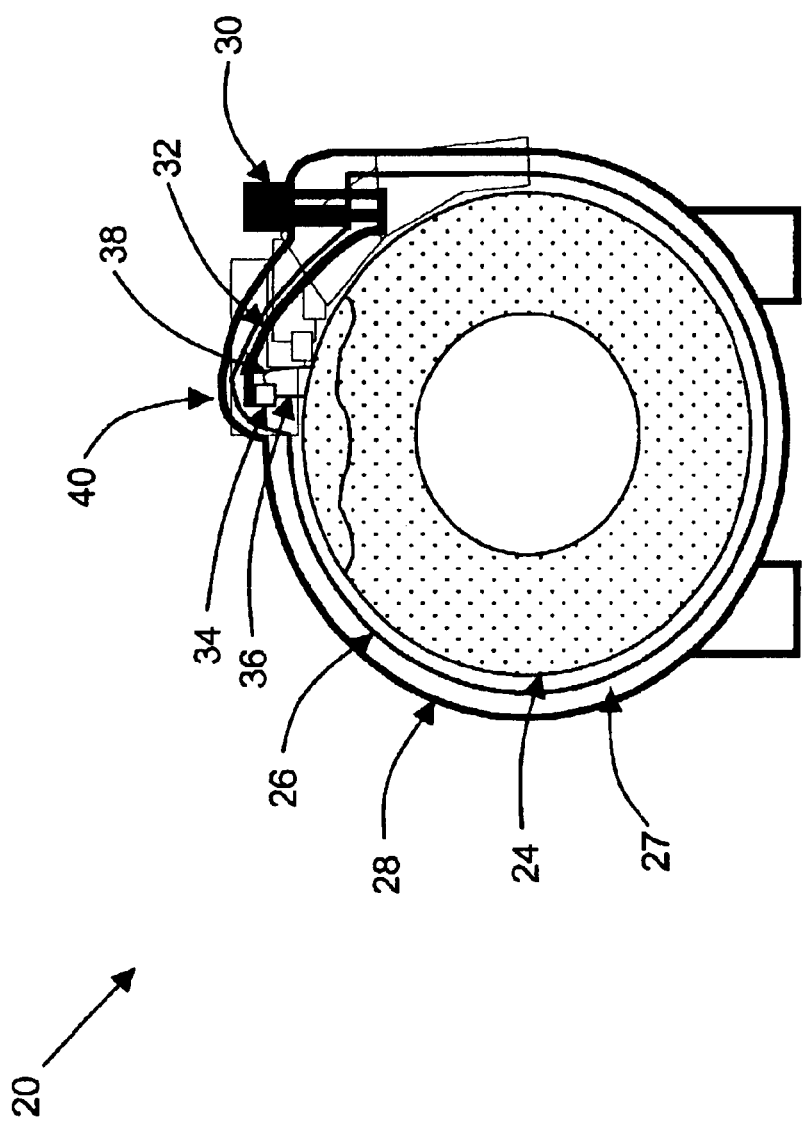
FIG. 2 is an illustration of a cylindrical superconducting magnet and cooling device assembly of an MRI system in accordance with an exemplary embodiment of the present invention.

Referring now to the figures, FIGS. 1 and 2 are two different illustrations of a superconducting magnet and cooling device assembly, shown generally at 20, of an MRI system according to an embodiment of the present invention. FIG. 1 illustrates an open system and FIG. 2 illustrates a cylindrical system. A magnet cartridge 22 comprising a superconducting MR magnet device is disposed within a fluid containing vessel housing (hereinafter referred to as "helium vessel 24"), such as a cryostat or pressure vessel. The superconducting MR magnet device may be of a zero boiloff design. The helium vessel 24 contains liquid helium or other liquid cryogen that surrounds the superconducting magnet device and provides cooling temperatures for superconducting operation. Surrounding the outer periphery of the liquid helium vessel 24 is a thermal shield 26 operable for reducing the penetration of heat from the exterior and therefore reducing evaporation of the liquid helium or cryogen. Surrounding the outer periphery of the thermal shield 26 is multi-layer insulation 27 or superinsulation that is wrapped onto the thermal shield and a vacuum insulation vessel 28. The vacuum vessel 28 separates the atmosphere outside of the vacuum vessel 28 from the liquid helium vessel 24. Multi-layer superinsulation may be interposed between the vacuum vessel 28 and thermal shield 26. A pulse tube cryocooler body, as will be described in detail below, is welded to the vacuum vessel 28 or sealed to the vacuum vessel 28 using an O-ring seal or metal seal such as heliocoflex or conflat type hyper seals. Both the weld, metal and the O-ring seal accomplish a leak tight interface needed for the cryostat. The pulse tube body is joined to the magnet 22 as a permanent part of the magnet cryostat.

The cooling device in the form of a pulse tube cryocooler, shown generally at 30, is operatively connected to the magnet cartridge 22 via a thermal bus bar 32, remote recondensor device 34, gas line 36 and liquid line 38. The pulse tube cryocooler 30 is of a conventional type known in the art operable for cooling to low temperatures. One pulse tube cryocooler 30 may be used in the practice of the present invention, eliminating the need for coldhead switching during imaging. The use of a pulse tube cryocooler 30 allows a more aggressive siting of the cylindrical magnets due to less coldhead vibration, producing better images and less ghosting. Pulse tube cryocoolers 30 known in the art are capable of providing cooling at about 4 K, liquid helium temperature. The pulse tube cryocooler 30 is a closed system that uses a compressor and valve switching at one end to generate an oscillating helium gas flow to the pulse tube cryocooler 30. The helium gas flow is operable for carrying heat away from a low temperature point or cold heat exchanger. A lower portion of the pulse tube cryocooler 30 comprises a cold head, a cold accumulator and a pulse tube. The lower portion is inserted into an upper surface 40 of the vacuum vessel 28. The gas line 36 and the liquid line 38 are a pair of thin walled tubes, such as bellows, that extend between the remote recondensor device 34 and apertures in the upper part of the helium vessel 24 above the liquid helium level. Lines 36 and 38 may be fabricated of stainless steel, for example.

Some conventional superconducting magnet designs incorporate a cryocooler sleeve which allows for the complete replacement of the coldhead. The sleeve adds extra heat load. The sleeve may add as much as 5 W to the thermal shield 26 and as much as 0.05 W to the 4 K helium vessel 24. The extra heat loads require higher capacity cryocoolers 30 and reduce the useful life of the cryocooler 30. The reliability and service configuration of the pulse tube cryocooler device 30 of the present invention allows for no sleeve, which reduces the heat leak to the magnet, thereby reducing the liquid helium boiloff and extending the life of the cryocooler 30. The pulse tube cryocooler 30 body becomes an integral part of the magnet cryostat.

In preferred embodiments, the pulse tubes are vertical to near vertically oriented, plus or minus about 10 degrees, with vertical being defined as the axis of the pulse tube being vertical with the cooling stations oriented downward. The pulse tube cryocooler 30 needs to be oriented vertically otherwise the thermal performance is degraded. Zero boiloff technology requires that the remote recondensor device 34 be mounted at the top of the magnet cartridge 22, above the maximum liquid helium level. The cooling station of the pulse tube cryocooler device 30 would normally be connected directly to the recondensor device 34, increasing the magnet ceiling height. The thermal bus bar 32 eliminates the need for the direct connection between the cryocooler device 30 and the recondensor device 34. In FIGS. 1 and 2, the cryocooler 30 is shown vertically oriented. FIGS. 1 and 2 illustrate improved magnet design concerning maximum magnet ceiling height for service and configuration of zero boiloff hardware.

The lower portion of the pulse tube cryocooler 30 is operatively connected to a thermal bus bar 32. The pulse tube cryocooler 30 is mounted low enough relative to the magnet top to allow servicing and moving/installation of the assembly 20. This arrangement may vary from magnet design to magnet design. This invention allows the height of the cryocooler 30 to be controlled. The cold head of the pulse tube cryocooler 30 can move vertically up and down wherever needed to in order to satisfy the overall height requirement. If the remote recondensor device 34 were mounted directly to the pulse tube cryocooler 30, as is the case in conventional systems, the added height to the magnet by the cooling device assembly 30 would restrict access to the pulse tube cryocooler 30, and restrict the minimum opening through which the assembly 20 can pass during installation. The introduction of the thermal bus bar 32 allows the pulse tube cryocooler 30 to be mounted lower while keeping the remote recondensor device 34 above the maximum liquid helium level.

Figure 3:
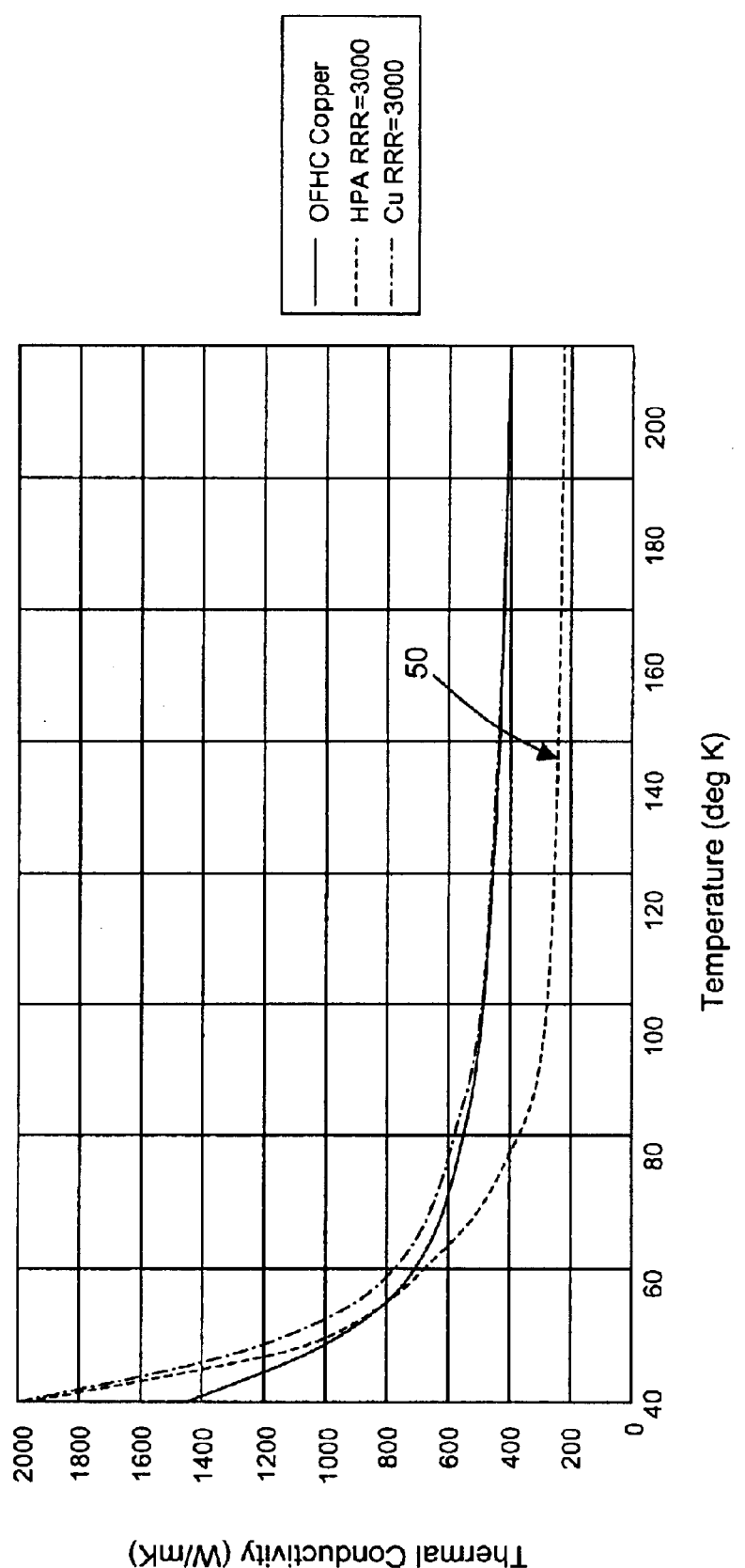
FIG. 3 is a graph illustrating a comparison of the thermal conductivity of aluminum versus copper in accordance with an exemplary embodiment of the present invention.

The thermal bus bar 32 is connected to the remote recondensor device 34 to keep the recondensor device 34 above the maximum liquid helium level. The thermal bus bar 32 is made from high thermal conductivity materials at cryogenic temperatures (4 K, for example) such as high purity aluminum (greater than 99.999 percent pure) or high purity copper (greater than 99.99 percent pure). Referring now to FIG. 3, a graph is shown comparing high-purity aluminum to high-purity copper. At 4 K, high purity aluminum and copper have nearly the same thermal conductivity. Aluminum has approximately half the thermal conductivity of high purity copper at higher temperatures, (e.g., above about 100 K, this is shown at 50). Thus, during normal operation, both would function similarly, but in the event of fault in the pulse tube (power loss, mechanical failure, etc.), the aluminum thermal bus bar 32 would load the liquid helium cryostat with one half the heat load as a copper bus bar. In addition to the percent purity level, the type of impurity is also important. The measure chosen for the type of impurity is the residual resisitivity ratio (RRR) defined as the ratio of the electrical resistivity at 4 K to the electrical resistivity at room temperature, 295 K, for example. The thermal conductivity is related to the electrical resistivity thru the Lorentz constant. High RRR (greater than 3000) aluminum or copper is needed to minimize the thermal loss due to the thermal bus bar 32. The thermal bus bar 32 may carry as much as 1.5 W at 4 K. The colder end of the bus bar 32 at the pulse tube 30 interface may be as much as 0.2 K lower in temperature than the warm end at the remote recondensor device 34. Every 0.1 K results in 0.1 W of lost cooling capacity, however, this number may vary depending upon the pulse tube cryocooler 30 used.

Because of the thermal bus bar 32, the cryocooler 30 can be moved around within the system 20. The present invention enables great flexibility in the placement of the pulse tube cryocooler 30 relative to the superconducting magnet 22. Using materials like high purity aluminum that yield lower thermal conductivities at higher temperatures makes that possible. No matter what purity copper is used, whether it is high or regular, it has roughly twice the thermal conductivity of high purity aluminum at temperatures above about 100 K, which temperatures indicate a fault condition. Using high purity aluminum is advantageous at temperatures above about 100 K where more resistance or less thermal conductivity is desired. Although copper or a cryogenic heat pipe may be used, aluminum is the preferred material of the present invention.

An important feature of zero boiloff superconducting magnets is that if the cryocooler 30 stops functioning (a fault event), liquid helium is boiled-off. During fault events, a poor conduction link between the cryocooler 30 and the helium vessel 24, provided by the aluminum, effectively reduces the helium boiloff since the aluminum has a lower thermal conductivity at temperatures above about 60 K.

The low temperature provided by the pulse tube cryocooler 30 is adequate to enable the recondensing of helium gas which flows from a helium vapor space above the liquid helium level of the helium vessel 24 to the remote recondensor device 34. The remote recondensor device 34 functions as a heat exchanger. The recondensor 34 recondenses helium gas into liquid helium which flows by gravity back into the helium vessel 24.

Figure 4:
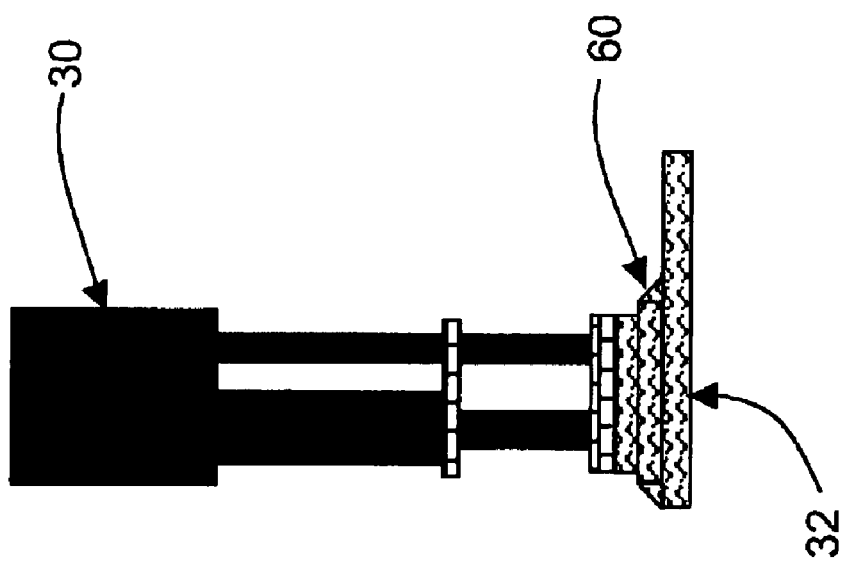
FIG. 4 is an illustration of a pulse tube cryocooler attached to a thermal bus bar using a weld in accordance with an exemplary embodiment of the present invention.
Figure 5:
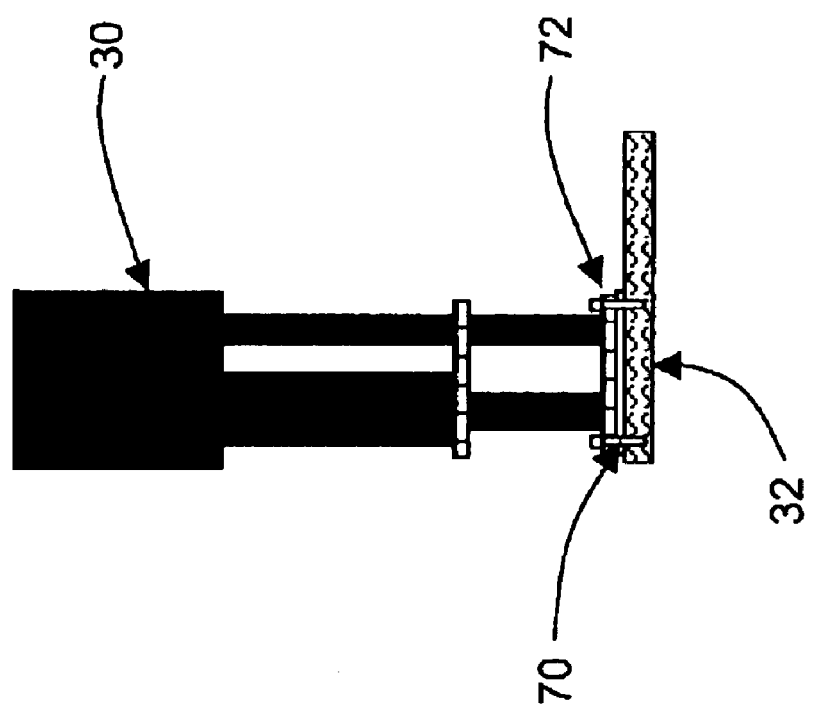
FIG. 5 is an illustration of a pulse tube cryocooler attached to a thermal bus bar using indium in the form of a bolted indium joint in accordance with an exemplary embodiment of the present invention.
Figure 6:
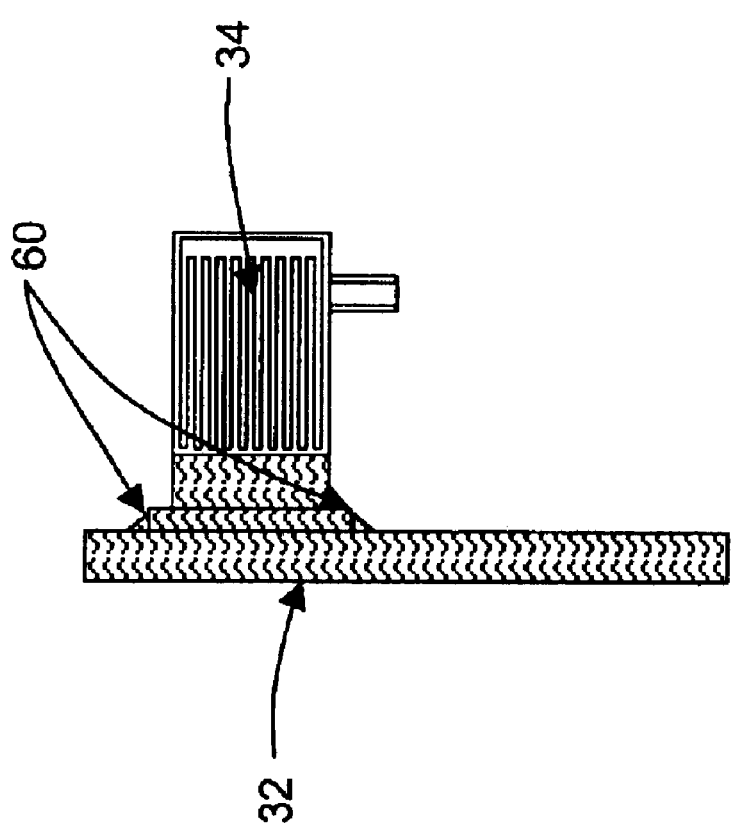
FIG. 6 is an illustration of a remote recondensor device attached to a thermal bus bar using a weld in accordance with an exemplary embodiment of the present invention.
Figure 7:
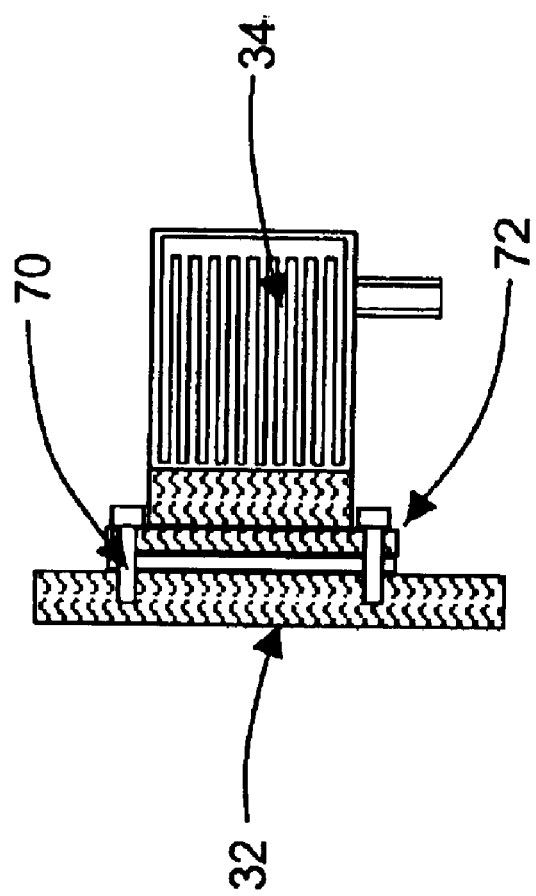
FIG. 7 is an illustration of a remote recondensor device attached to a thermal bus bar using indium in the form of a bolted indium joint in accordance with an exemplary embodiment of the present invention.

How the pulse tube cryocooler 30 and remote recondensor device 34 are mounted to the thermal bus bar 32 is crucial to thermal performance. A low thermal loss interface is needed between the interface of the pulse tube cryocooler 30 and the thermal bus bar 32, and between the thermal bus bar 32 and the remote recondensor device 34. The pulse tube cryocooler 30 may be attached to the thermal shield 26 and the thermal bus bar 32 by multiple ways, such as through a clamped joint using indium or, directly welded. An indium interface will provide a temperature difference of about 0.2 K or less when the interface is operating at or near 4 K. A welded interface will provide a temperature difference that is much better than the indium interface, almost non-detectable. FIG. 4 shows the pulse tube cryocooler 30 attached to the thermal bus bar 32 using a fillet weld 60. FIG. 5 shows the pulse tube cryocooler 30 attached to the thermal bus bar 32 using indium 70 in the form of a bolted indium joint 72. FIG. 6 shows the remote recondensor device 34 attached to the thermal bus bar 32 using a fillet weld 60. FIG. 7 shows the remote recondensor device 34 attached to the thermal bus bar 32 using indium 70 in the form of a bolted indium joint 72.

In preferred embodiments of the present invention, welding the cryocooler 30 to the thermal bus bar 32 is preferred. Friction welding may be used to weld high-purity aluminum to copper. Friction welding is a solid-state process that is achieved through frictional heat. The heat is generated by a controlled rubbing of two components, the aluminum of the thermal bus bar 32 and the copper of the cryocooler 30, until the materials reach a plastic state, at which time the plasticized materials begin to form layers that intertwine with one another. A friction welding machine is used to control the rubbing through a series of unique parameters for rotational speed, axial force and time. In the first step of the process, the thermal bus bar 32 and the cryocooler 30 are loaded into the welder, one in a rotating spindle and the other in a stationary clamp. Special tooling is required since these parts do not have a natural axis of symmetry. The component in the spindle is brought up to a pre-determined rotational speed and then a pre-determined axial force is applied. These conditions are maintained for a pre-determined amount of time until desired temperatures and material conditions exist. The rotational speed is then stopped and an increased axial force is applied until a desired upset is obtained. Friction welding is the most efficient form of welding because there is no material between the copper and the aluminum. Brazing may also be used in the practice of the present invention.

The pulse tube cryocooler 30 is welded to the thermal bus bar 32. The remote recondensor device 34 is also welded to the thermal bus bar 32. Because the thermal bus bar 32 is preferably made from aluminum, the pulse tube cryocooler 30 and the remote recondensor device 34 should be made with a piece of aluminum friction welded to them. Pulse tube 30 interfaces are typically copper, which is easily brazed to stainless steel, and the pulse tube body is typically made from stainless steel.

It is apparent that there have been provided, in accordance with the systems of the present invention, pulse tube cryocooler integration and interface designs for open and cylindrical MR superconducting magnets. Although the systems of the present invention have been described with reference to preferred embodiments and examples thereof, other embodiments and examples may perform similar functions and/or achieve similar results. All such equivalent embodiments and examples are within the spirit and scope of the present invention and are intended to be covered by the following claims.

What is claimed is:

1. A magnetic resonance assembly, comprising;
   a liquid cryogen vessel;
   a liquid cryogen cooled superconducting magnet disposed within the liquid cryogen vessel;
   a closed vacuum vessel surrounding the liquid cryogen vessel and spaced from the liquid cryogen vessel;
   a cooling device fixably attached to the closed vacuum vessel operable for cooling a liquid cryogen that is used to cool the liquid cryogen cooled superconducting magnet;
   a heat exchanger device in thermal contact with the liquid cryogen vessel operable for heat exchange; and
   a rigid bus bar in thermal contact with the cooling device and the heat exchanger device,
   wherein the rigid bus bar comprises a low thermal loss interface between the cooling device and the heat exchanger device, thereby allowing the cooling device and the heat exchanger device to be positioned apart from and not in direct contact with one another, which in turn allows the cooling device to be positioned anywhere on the closed vacuum vessel at the top of or above the liquid cryogen cooled superconducting magnet, thereby allowing the overall height of the magnetic resonance assembly to be minimized as compared to positioning the cooling device directly above the heat exchanger device.

2. The assembly of claim 1, wherein the cooling device is a pulse tube cryocooler.

3. The assembly of claim 1, wherein the rigid bus bar is fixably connected to the cooling device and the heat exchanger device by way of a weld, joint, clamp, bolted indium joint, or combinations thereof.

4. The assembly of claim 1, wherein the rigid bus bar is made from a material selected from the group consisting of high purity aluminum and high-purity copper, wherein high purity is defined as greater than 99.999 percent by weight for aluminum and 99.99 percent by weight for copper.

5. The assembly of claim 1, wherein the heat exchanger device is disposed within the vacuum vessel in any location above a maximum liquid cryogen level.

6. The assembly of claim 1, wherein the heat exchanger device is a remote recondensor device.

7. The assembly of claim 1, wherein the heat exchanger device is connected to the liquid cryogen vessel via one or more lines operable for transporting gas, wherein the lines allow cryogen gas to flow upward into the heat exchanger device, allow recondensed cryogen liquid to flow back into the liquid cryogen vessel, and provide thermal and vibration isolation between the heat exchanger device and the liquid cryogen vessel.

8. The assembly of claim 1, wherein the liquid cryogen comprises helium.

9. The assembly of claim 1, further comprising a thermal shield disposed in the space between the closed vacuum vessel and the liquid cryogen vessel.

10. The assembly of claim 1, wherein the cooling device provides cooling to a temperature of about 4 K.

11. A superconducting magnet system, comprising:
    a vacuum vessel;
    a liquid cryogen vessel;
    a superconducting magnet;
    a thermal shield disposed in a space between the vacuum vessel and the liquid cryogen vessel;
    a pulse tube cryocooler fixably attached to the vacuum vessel;
    a recondensor device connected to the liquid cryogen vessel via one or more tubes and disposed within the vacuum vessel; and
    a rigid thermal bus bar fixably attached to the pulse tube cryocooler and the recondensor device;
    wherein the rigid thermal bus bar is comprised of high purity aluminum or high purity copper, wherein high purity aluminum or high purity copper is defined as greater than 99.999 percent by weight for aluminum and 99.99 percent by weight for copper, wherein the rigid thermal bus bar comprises a low thermal loss interface between the pulse tube cryocooler and the recondensor device, thereby allowing the pulse tube cryocooler and the recondensor device to be positioned apart from and not in direct contact with one another, which in turn allows the pulse tube cryocooler to be positioned anywhere on the vacuum vessel at the top of or above the superconducting magnet, thereby allowing the overall height of the superconducting magnet system to be minimized as compared to positioning the cooling device directly above the recondensor device.

12. The system of claim 11, wherein a coldhead of the pulse tube cryocooler may be moved vertically up and down in order to satisfy an overall height requirement of the system.

13. The system of claim 11, wherein the rigid thermal bus bar is operable for allowing the pulse tube cryocooler to be positioned on the vacuum vessel at any location at the top of or above the superconducting magnet while keeping the recondensor device positioned above a maximum liquid helium level.

14. The system of claim 11, wherein the recondensor device is mounted at a spatial separation from an interface of the pulse tube cryocooler, and wherein the recondensor device and the pulse tube cryocooler are connected to one another by the rigid thermal bus bar.

15. The system of claim 11, wherein the pulse tube cryocooler and the recondensor device are connected to the rigid thermal bus bar by a weld, joint or clamp.

16. The system of claim 15, wherein the weld comprises a friction weld.

17. The system of claim 11, wherein the pulse tube cryocooler is attached to the vacuum vessel as a permanent part of the superconducting magnet system.

18. A magnetic resonance assembly, comprising;
    a liquid cryogen vessel;
    a liquid cryogen cooled superconducting magnet disposed within the liquid cryogen vessel;

a closed vacuum vessel surrounding the liquid cryogen vessel and spaced from the liquid cryogen vessel;

a cooling means fixably attached to the vacuum vessel;

a heat exchange means in thermal contact with the liquid cryogen vessel; and a rigid connecting and separating means for connecting together and providing a spatial separation between the cooling means and the heat exchange means, wherein the rigid connecting and separating means comprises a low thermal loss interface between the cooling means and the heat exchange means, thereby allowing the cooling means and the heat exchange means to be positioned apart from and not in direct contact with one another, which in turn allows the cooling means to be positioned anywhere on the closed vacuum vessel at the top of or above the liquid cryogen cooled superconducting magnet, thereby allowing the overall height of the magnetic resonance assembly to be minimized as compared to positioning the cooling device directly above the heat exchange means.

19. The assembly of claim 18, wherein the rigid connecting and separating means is connected to the cooling means and the heat exchange means by a weld, joint, clamp, bolted indium joint, or combinations thereof.

20. The assembly of claim 18, wherein the rigid connecting and separating means comprises at least 99.999 percent by weight of aluminum or 99.99 percent by weight of copper.

21. The assembly of claim 18, wherein the heat exchange means is connected to the liquid cryogen vessel via one or more lines operable for transporting gas, wherein the lines allow cryogen gas to flow upward into the heat exchange means, allow recondensed cryogen gas to flow back into the liquid cryogen vessel, and provide thermal and vibration isolation between the heat exchange means and the liquid cryogen vessel.

22. The assembly of claim 18, wherein the liquid cryogen vessel comprises liquid helium.

23. The assembly of claim 18, further comprising a thermal shield disposed in the space between the closed vacuum vessel and the liquid cryogen vessel.

24. The assembly of claim 18, wherein the cooling means provides cooling to a temperature of about 4 K.

25. The assembly of claim 1, wherein the cooling device is not positioned directly above the heat exchanger device.

* * * * *